(12) United States Patent
Son et al.

(10) Patent No.: US 9,301,392 B2
(45) Date of Patent: Mar. 29, 2016

(54) CONDUCTIVE PARTICLE AND METHOD OF MANUFACTURING THE SAME

(71) Applicant: HANWHA CHEMICAL CORPORATION, Seoul (KR)

(72) Inventors: Won-Il Son, Seoul (KR); You-Jin Sim, Daejon (KR); Seok-Heon Oh, Daejeon (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 116 days.

(21) Appl. No.: 13/978,184

(22) PCT Filed: Nov. 23, 2012

(86) PCT No.: PCT/KR2012/009973
§ 371 (c)(1),
(2) Date: Aug. 1, 2013

(87) PCT Pub. No.: WO2013/077666
PCT Pub. Date: May 30, 2013

(65) Prior Publication Data
US 2014/0076620 A1    Mar. 20, 2014

(30) Foreign Application Priority Data

Nov. 24, 2011    (KR) .................. 10-2011-0123675

(51) Int. Cl.
*H05K 1/09*    (2006.01)
*H01B 1/02*    (2006.01)
(Continued)

(52) U.S. Cl.
CPC .................. *H05K 1/092* (2013.01); *H01B 1/02* (2013.01); *H01B 1/026* (2013.01); *H01B 1/22* (2013.01); *H01L 31/022425* (2013.01); *Y02E 10/50* (2013.01)

(58) Field of Classification Search
CPC .............. H05K 2201/0221; H05K 2201/0218; H05K 2201/0272; H05K 2201/0215; H05K 3/323; H01R 13/03; B22F 1/025
USPC .............. 428/328, 403, 447, 220, 327, 32.74, 428/357, 546, 547, 548, 57; 174/257, 258, 174/259, 126.2; 361/783
See application file for complete search history.

(56) References Cited

U.S. PATENT DOCUMENTS 4,711,814 A * 12/1987 Teichmann .................... 428/403
2006/0053972 A1* 3/2006 Liu et al. .......................... 75/373
(Continued)

FOREIGN PATENT DOCUMENTS

CN    1768402 A    5/2006
CN    101309993 A    11/2008
(Continued)

OTHER PUBLICATIONS

International Search Report for Application No. PCT/KR2012/009973 dated Jan. 29, 2013 (2 pages).
(Continued)

*Primary Examiner* — Steven T Sawyer
(74) *Attorney, Agent, or Firm* — Lex IP Meister, PLLC

(57) ABSTRACT

Disclosed herein is a conductive particle, including: a base particle containing a metal; a seed particle formed on a surface of the base particle; and a first metal layer formed on the base particle, wherein the first metal layer includes a protrusion surrounding the seed particle. The conductive particle has excellent specific resistance characteristics when it is sintered because it has nanosized protrusions formed on the surface of a metal base particle.

26 Claims, 8 Drawing Sheets

(51) Int. Cl.
*H01L 31/0224* (2006.01)
*H01B 1/22* (2006.01)

(56) References Cited

U.S. PATENT DOCUMENTS

| | | | |
|---|---|---|---|
| 2007/0134491 A1* | 6/2007 | Atsuki et al. | 428/402 |
| 2008/0034921 A1* | 2/2008 | Vanheusden et al. | 75/362 |
| 2010/0025097 A1* | 2/2010 | Kojima et al. | 174/261 |
| 2011/0088935 A1* | 4/2011 | Ishimatsu et al. | 174/257 |
| 2011/0155430 A1* | 6/2011 | Lee et al. | 174/257 |

FOREIGN PATENT DOCUMENTS

| | | |
|---|---|---|
| CN | 101684214 A | 3/2010 |
| CN | 102089832 A | 6/2011 |
| EP | 2178094 | 4/2010 |
| EP | 2242065 | 10/2010 |
| JP | 2003197028 | 7/2003 |
| JP | 2007242307 | 9/2007 |
| JP | 20090259804 | 11/2009 |
| JP | 2004238730 | 1/2010 |
| KR | 1020060065784 | 6/2006 |
| KR | 1020080058610 | 6/2008 |
| KR | 1020110034606 | 4/2011 |
| WO | 2007058159 A1 | 5/2007 |

OTHER PUBLICATIONS

EP128512712 Extended European Search Report dated Feb. 25, 2015 (5 pages).

\* cited by examiner

TEM  Cu mapping

Ag mapping  Ag/Cu over layer

TEM  Cu mapping

Ag mapping  Ag/Cu over layer

CONDUCTIVE PARTICLE AND METHOD OF MANUFACTURING THE SAME

CROSS-REFERENCE TO RELATED APPLICATIONS

This application is a national stage filing under 35 U.S.C. 371 of International Application No. PCT/KR2012/009973, which claims priority to and the benefit of Korean Patent Application No. 10-2011-0123675 in the Korea Intellectual Property Office filed on Nov. 24, 2011, which is hereby incorporated by reference in its entirety into this application.

TECHNICAL FIELD

The present invention relates to a conductive particle and a method of manufacturing the same, and more particularly, to a conductive particle which has excellent specific resistance characteristics when it is sintered because it has nanosized protrusions formed on the surface of a metal base particle, and a method of manufacturing the same.

BACKGROUND

Currently, in a process of forming a microstructure, such as a metal pattern, an insulation layer or a separation membrane, used to manufacture an electric/electronic device, an optical patterning (photolithography) method, based on exposure and etching, is generally used. However, this optical patterning method is an energy-intensive high-cost manufacturing technology including several complicated processes. Moreover, the optical patterning method is problematic in that waste gas, waste water and the like are discharged during exposure and etching processes, thus causing environmental pollution. Therefore, it is required that a simple, low-cost and environment-friendly process be developed instead of the optical patterning process based on exposure/etching.

Thus, a process of preparing an electrode material by forming a metal coating layer on a conductive polymer such as poly(ethylenedioxythiophene) doped with poly(styrene sulfonic acid) has been developed. For example, Japanese Patent Publication Nos. 2003-197028 and 2004-238730 disclose a conductive particle including a resin-made spherical core material whose surface is provided with a plated layer. A conductive polymer is advantageous in that it can be easily patterned by a solution process such as screen printing, but is disadvantageous in that it is difficult to obtain reliable electric resistance because its conductivity is far lower than that of a metal material.

Therefore, research into a material which can be applied to a solution process of easily forming a pattern using a metal material having excellent conductivity is required. For example, a process of forming a metal material into metal nanoparticles and then dispersing the metal nanoparticles in a solvent is being spotlighted. When a metal material is formed into metal nanoparticles, the melting point of the metal material can be remarkably lowered, thus providing the basis for forming a conductive film for an electrode using low-temperature heat treatment.

However, when metals such as copper (Cu), nickel (Ni) and the like, which are generally used as cheap electrode materials, are formed into metal nanoparticles, the metal nanoparticles become an obstacle to sintering behavior at the time of heat treatment because they tend to be thermodynamically oxidized, with the result that it is not easy to form a high-conductivity film. Further, silver (Ag) and gold (Au), which are also used as electrode materials, do not have such a problem of oxidization, but they are expensive, so their usefulness is limited. Therefore, it is required to develop a novel electrode material which is cheap and can provide high conductivity.

SUMMARY

Accordingly, the present invention has been devised to solve the above-mentioned problems, and an object of the present invention is to provide a conductive particle which can be used as a cheap electrode material and which can provide high conductivity.

Another object of the present invention is to provide a method of manufacturing the conductive particle.

In order to accomplish the above object, an aspect of the present invention provides a conductive particle, comprising: a base particle containing a metal; a seed particle formed on a surface of the base particle; and a first metal layer formed on the base particle, wherein the first metal layer includes a protrusion surrounding the seed particle.

Another aspect of the present invention provides a conductive particle, comprising: a base particle containing a metal; a second metal layer formed on the base particle; a seed particle formed on a surface of the second metal layer; and a first metal layer formed on the second metal layer, wherein the first metal layer includes a protrusion surrounding the seed particle.

According to one embodiment of the present invention, in the conductive particle, the base particle may be a spherical particle having an average particle size of 0.01 to 1,000 μm.

According to one embodiment of the present invention, the base particle and the first metal layer may each the same or different and independently include any one metal selected from the group consisting of Au, Ag, Co, Ni, Co, Cu, Ni, Pd, Sn and alloys including two or more thereof.

According to one embodiment of the present invention, the seed particle may include any one transition metal selected from the group consisting of Pd, Cu, Ru, Pt, Ag, Co and alloys including tow or more thereof.

Still another aspect of the present invention provides a method of manufacturing a conductive particle, comprising the steps of: reacting a base particle containing a metal with a transition metal compound solution to form a seed particle on a surface of the base particle; and reacting a first metal compound solution with the base particle provided with the seed particle to form a first metal layer including a protrusion surrounding the seed particle.

Still another aspect of the present invention provides a method of manufacturing a conductive particle, comprising the steps of: reacting a base particle containing a metal with a second metal compound solution to form a second metal layer on a surface of the base particle; reacting a transition metal compound solution with the base particle provided with the second metal layer to form a seed particle on a surface of the second metal layer; and reacting a first metal compound with the base particle provided with the seed particle to form a first metal layer including a protrusion surrounding the seed particle on the second metal layer.

According to the present invention, since the conductive particle of the present invention includes a conductive metal as a core material, it has high conductivity and a low melting point, so it can be formed into a conductive film for an electrode by low-temperature heat treatment.

Further, the conductive particle has excellent specific resistance characteristics when it is sintered because it has nanosized protrusions formed on the outermost surface thereof, and has high adhesivity to metal particles because of the smooth plated layer. Further, the conductive particle can be easily used to form an electrode because it can be patterned by a solution process such as screen printing or the like.

BRIEF DESCRIPTION OF THE DRAWINGS

The above and other objects, features and advantages of the present invention will be more clearly understood from the following detailed description taken in conjunction with the accompanying drawings, in which.

REFERENCE NUMERALS

Figure 1:
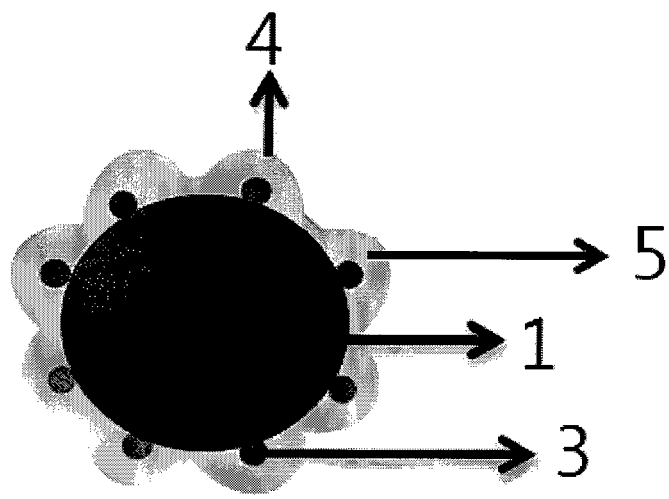
FIG. 1 is a sectional view showing a structure of a conductive particle according to an embodiment of the present invention.

1: base particle
2: second metal layer
3: seed particle
4: protrusion
5: first metal layer

DETAILED DESCRIPTION

Hereinafter, embodiments of the present invention will be described more in detail with reference to the attached drawings.

The conductive particle according to an embodiment of the present invention comprises: a base particle containing a metal; a seed particle formed on a surface of the base particle; and a first metal layer formed on the base particle, wherein the first metal layer includes a protrusion surrounding the seed particle.

The conductive particle according to another embodiment of the present invention comprises: a base particle containing a metal; a second metal layer formed on the base particle; a seed particle formed on a surface of the second metal layer; and a first metal layer formed on the second metal layer, wherein the first metal layer includes a protrusion surrounding the seed particle.

The method of manufacturing a conductive particle according to an embodiment of the present invention comprises the steps of: reacting a base particle containing a metal with a transition metal compound solution to form a seed particle on a surface of the base particle; and reacting a first metal compound solution with the base particle provided with the seed particle to form a first metal layer including a protrusion surrounding the seed particle.

The method of manufacturing a conductive particle according to another embodiment of the present invention comprises the steps of: reacting a base particle containing a metal with a second metal compound solution to form a second metal layer on a surface of the base particle; reacting a transition metal compound solution with the base particle provided with the second metal layer to form a seed particle on a surface of the second metal layer; and reacting a first metal compound with the base particle provided with the seed particle to form a first metal layer including a protrusion surrounding the seed particle on the second metal layer.

The conductive particle of the present invention includes nanosized protrusions on the outermost surface thereof and a smooth plated layer on a part where the protrusions are not formed. This conductive particle has excellent specific resistance characteristics when the conductive particle is sintered because the conductive particle has nanosized protrusions formed on the surface thereof, and has high adhesivity to metal particles because of the smooth plated layer.

Further, according to the method of manufacturing a conductive particle of the present invention, seed particles are formed on the surface of the base particle, so that protrusions surrounding the seed particles can be easily and uniformly formed by a substitution reaction, and a smooth metal layer can be formed on the surface of the base particle, the surface thereof not having the seed particles, thereby easily and efficiently producing the conductive particle.

In the present invention, the terms "first", "second" and the like are used only to differentiate a certain component from other components.

Further, in the present invention, when it is mentioned that each layer or element is formed "on" another layer or element, it means that the each layer or element may be directly formed on the another layer or element, or a further layer or element may be additionally formed between the layers, on a subject or on a substrate.

The present invention may be variously modified and may have various forms. Therefore, embodiments of the present invention will be described in detail. However, these embodiments are set forth to illustrate the present invention, and the technical scope of the present invention is not limited thereto.

Hereinafter, the conductive particle and manufacturing method thereof according to the present invention will be described in detail with reference to the accompanying drawings.

Conductive Particle

FIG. 1 is a sectional view showing a structure of a conductive particle according to an embodiment of the present invention.

Referring to FIG. 1, the conductive particle of the present invention includes a base particle 1 containing a metal, seed particles 3 formed on the surface of the base particle 1, and a first metal layer 5 formed on the base particle 1. Here, the first metal layer 5 includes protrusions 4 surrounding the seed particles 3.

According to one embodiment of the present invention, the base particle 1 may be a spherical particle. That is, the base particle may also be elliptical similar to spherical, and preferably, spherical.

The base particle 1 includes a conductive metal. For example, the base particle 1 may include at least one selected from the group consisting of Au, Ag, Co, Cu, Ni, Pd, Pt, Sn, and alloys thereof. The base particle 1 may be made of a conductive metal used as a cheap electrode material. For example, the base particle 1 may be made of copper (Cu) or nickel (Ni).

According to one embodiment of the present invention, the base particle 1 may have an average particle size of about 0.01 to about 1,000 μm. When the average particle size thereof is less than 0.01 μm, the conductive particle may not come into contact with the surface of an electrode, and poor contact may occur when electrodes are spaced apart from each other by a predetermined distance. When the average particle size thereof is more than 1,000 μm, it may be difficult to form a microelectrode. Preferably, the average particle size thereof may be about 0.02 to about 100 μm, more preferably about 0.02 to about 20 μm, and most preferably about 0.02 to about 5 μm.

The seed particles 3 are formed on the surface of the base particle 1. The seed particles 3 serve as catalyst seeds for forming the following protrusions 4.

According to one embodiment of the present invention, each of the seed particles 3 may include at least one transition metal selected from the group consisting of Pd, Cu, Ru, Pt, Ag, Co and alloys thereof.

The first metal layer 5 is disposed on the base particle 1, and includes protrusions 4 surrounding the seed particles 3. Further, a part of the first metal layer, the part which is not provided with the protrusions 4, directly faces the base particle 1, and has a smooth surface.

According to one embodiment of the present invention, the first metal layer 5 may include at least one metal selected from the group consisting of Au, Ag, Co, Cu, Ni, Pd, Pt, Sn and alloys thereof. Preferably, the first metal layer 5 may be made of silver (Ag) or gold (Au), which does not cause a problem of oxidation.

According to one embodiment of the present invention, the seed particles 3 and the first metal layer 5 may include metals different from each other.

Each of the protrusions 4 is formed such that it surrounds the seed particle formed on the surface of the base particle 1. The shape of the protrusion 4 is not particularly limited, but the protrusion 4 may have a spherical shape or a shape similar to the spherical shape. The protrusion may have a average height of about 5 to about 100 nm, preferably, about 5 to about 20 nm.

Figure 2:
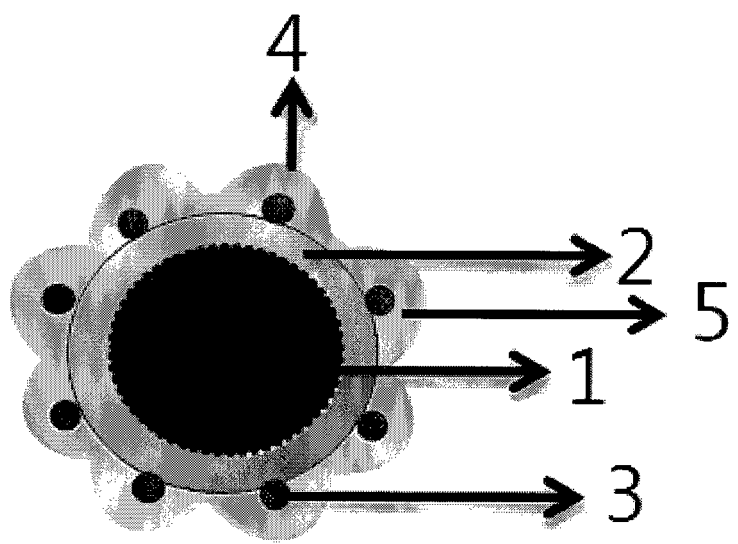
FIG. 2 is a sectional view showing a structure of a conductive particle according to another embodiment of the present invention.

FIG. 2 is a sectional view showing a structure of a conductive particle according to another embodiment of the present invention.

Referring to FIG. 2, the conductive particle of the present invention includes a base particle 1 containing a metal, a second metal layer 2 formed on the base particle 1, seed particles 3 formed on the surface of the second metal layer 2, and a first metal layer 5 formed on the second metal layer 2. Here, the first metal layer 5 includes protrusions 4 surrounding the seed particles 3.

Descriptions of the base particle 1, the seed particles 3, the protrusions 4 and the first metal layer 5 were aforementioned in the conductive particle with reference to FIG. 1.

According to one embodiment of the present invention, the conductive particle further includes the second metal layer 2 formed between the base particle 1 and the first metal layer 5.

The second metal layer 2 includes a conductive metal. For example, the second metal layer 2 may include at least one selected from the group consisting of Au, Ag, Co, Cu, Ni, Pd, Pt, Sn, and alloys thereof. Preferably, the second metal layer 2 may be made of silver (Ag) or gold (Au), which does not cause a problem of oxidation.

Further, the thickness of the second metal layer 2 is not particularly limited, but may be about 10 to about 100 nm.

According to one embodiment of the present invention, the second metal layer 2 may be formed by plating a metal on the surface of the base particle 1.

According to one embodiment of the present invention, the first metal layer 5 and the second metal layer 2 may include metals the same as each other. Further, the first metal layer 5 and the second metal layer 2 may include metals different from each other.

As shown in FIGS. 1 and 2, the protrusions 4 are located at the outermost surface of the conductive particle of the present invention. Therefore, the conductive particle of the present invention has excellent specific resistance characteristics compared to a conventional conductive particle because of the protrusions 4 formed on the surface thereof, and a part of the conductive particle, the part which is not provided with the protrusions 4, is provided with a smooth metal layer, thus obtaining a conductive particle having excellent adhesivity.

The conductive particle of the present invention can be used as various raw materials of electric/electronic devices because it has the advantage of having excellent specific resistance characteristics, high conductivity and low production cost. For example, an electrode pattern including the conductive particle can be applied to various electronic devices requiring high conductivity and reliability, such as a solar cell, a printed circuit, a printed circuit board (PCB), a flexible printed circuit board, a touch screen panel (TSP), a plasma display panel (PDP), a thin film transistor liquid crystal display (TFT-LCD), a radio-frequency identification (RFID), and the like.

Specifically, the conductive particle of the present invention can be used to form an electrode pattern on a substrate using various coating processes, such as spin coating, dip coating, drop casting, inkjet printing, screen printing, gravure printing, off-set printing and the like after dispersing the conductive particles in a solvent.

Method of Manufacturing Conductive Particle

Figure 3:
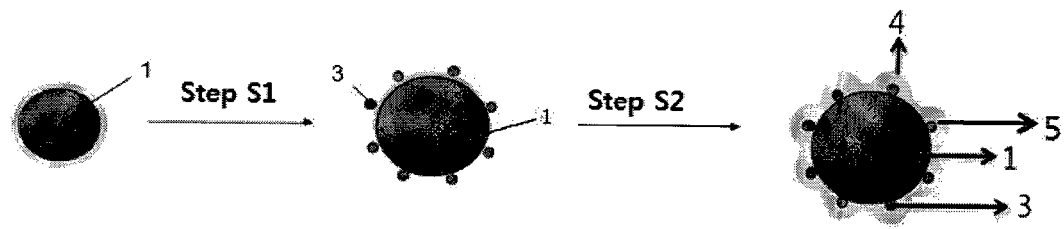
FIG. 3 is a schematic process view showing a method of manufacturing a conductive particle according to an embodiment of the present invention.

FIG. 3 is a schematic process view showing a method of manufacturing a conductive particle according to an embodiment of the present invention.

The method of manufacturing a conductive particle according to an embodiment of the present invention includes the steps of: reacting a base particle containing a metal with a transition metal compound solution to form a seed particle on a surface of the base particle; and reacting a first metal compound solution with the base particle provided with the seed particle to form a first metal layer including a protrusion surrounding the seed particle.

Referring to FIG. 3, first, a base particle 1 including a metal 1 is reacted with a transition metal compound solution to form seed particles 3 on the surface of the base particle 1 (Step S1).

The base particle 1 may include at least one selected from the group consisting of Au, Ag, Co, Cu, Ni, Pd, Pt, Sn, and alloys thereof. As the base particle 1, a commercially-available base particle may be used. Preferably, the base particle 1 may be a metal particle such as copper (Cu) or nickel (Ni).

According to one embodiment of the present invention, the base particle 1 may be a metal particle having an average particle size of about 0.01 to about 1,000 μm.

The transition metal compound solution is reacted with the base particle 1 to form seed particles 3 on the surface of the base particle 1.

The seed particles 3 serve as catalyst seeds for forming the following protrusions 4. According to one embodiment of the present invention, each of the seed particles 3 may include at least one transition metal selected from the group consisting of Pd, Cu, Ru, Pt, Ag, Co and alloys thereof.

The seed particles 3 may be formed by introducing the transition metal compound solution into the base particle 1 or the base particle-dispersed solution and then reacting the transition metal compound solution with the base particle 1.

The reaction temperature of the base particle and the transition metal compound solution may be about 80 to about 150° C., but is not limited thereto.

The transition metal compound solution is prepared by dissolving a transition metal compound in a solvent. The concentration of the transition metal compound relates to the size and number of the following protrusions 4. According to one embodiment of the present invention, the concentration of the transition metal compound may be about 0.01 to about 50 g/L, preferably about 0.01 to about 30 g/L, and more preferably about 0.01 to about 20 g/L. When the concentration of the transition metal compound is too low, it may be difficult to precipitate a transition metal, and the size of the protrusion may become too small. When the concentration thereof exceeds 50 g/L, the size of the protrusion increases, but cost also increases.

As the solvent for dissolving the transition metal compound, an aliphatic amine compound of 6 to 22 carbon atoms having a linear or branched structure, or an unsaturated amine compound of 6 to 22 carbon atoms having a linear or branched structure may be used. The amine compound may include at least one selected from the group consisting of hexylamine, heptylamine, octylamine, oleylamine, decylamine, dodecylamine, 2-ethylhexylamine, 1,3-dimethyl-n-butylamine, 1-aminotridecane, and mixtures thereof.

Subsequently, a first metal compound solution is reacted with the base particle 1 provided with the seed particles 3 to form a first metal layer 5 including protrusions 4 surrounding the seed particles 3 (Step S2).

According to one embodiment of the present invention, the first metal layer 5 may include at least one metal selected from the group consisting of Au, Ag, Co, Cu, Ni, Pd, Pt, Sn and alloys thereof. Preferably, the first metal layer 5 may be made of silver (Ag) or gold (Au), which does not cause a problem of oxidation.

The first metal layer 5 is formed by reacting the first metal compound solution with the base particle 1 provided with the seed particles 3.

The first metal compound solution is prepared by dissolving a first metal compound in a solvent. The first metal compound is reduced by a thermal reduction reaction or a reduction reaction using a reductant, and then grown to surround the seed particles 3, thus forming protrusions 4. Further, the first metal layer 5 having a smooth surface is formed on a part of the base particle 1, the part which is not provided with the seed particles 3, by a reduction reaction.

The amount of the first metal compound in the first metal compound solution may be about 0.1 to about 30 wt %. When the amount thereof is less than 0.1 wt %, the first metal layer 5 cannot be uniformly formed. When the amount thereof is more than 30 wt %, the first metal compound cannot be sufficiently dissolved because the amount thereof exceeds the solubility thereof.

It is preferred that a compound, which does not include an anion, such as sulfur (S), chlorine (Cl) or the like, causing a short circuit at the time of forming an electrode, be used as the first metal compound. For example, when a silver (Ag) compound is used as the first metal compound, the silver (Ag) compound may be at least one selected from the group consisting of silver diacetate, silver cyclohexanebutyrate, silver 2-ethylhexanoate, silver neodecanoate and silver acetylacetonate.

As the solvent for dissolving the first metal compound, an aliphatic amine compound of 6 to 22 carbon atoms having a linear or branched structure, or an unsaturated amine compound of 6 to 22 carbon atoms having a linear or branched structure may be used. The amine compound may include at least one selected from the group consisting of hexylamine, heptylamine, octylamine, oleylamine, decylamine, dodecylamine, 2-ethylhexylamine, 1,3-dimethyl-n-butylamine, 1-aminotridecane, and mixtures thereof.

When the first metal layer 5 is formed by a thermal reduction reaction, the thermal reduction reaction may be performed at a temperature at which the first metal compound, as a metal compound precursor, is thermally decomposed or at a higher temperature. For example, when a silver compound is used as the first metal compound, the thermal reduction reaction may be performed at a temperature of about 120 to about 220° C.

Further, when the first metal layer 5 is formed by a reduction reaction using a reductant, the reductant is not particularly limited as long as the reductant can reduce the first metal compound. For example, the reductant may be selected from the group consisting of an erythorbic acid compound, a hydrazine compound, a hydroquinone compound, a boron compound, a phosphoric acid compound, and salts thereof. Specifically, examples of the erythorbic acid compound may include ascorbic acid (L-ascorbic acid) and a salt thereof; examples of the hydrazine compound may include p-hydrazine benzosulfonic acid, hydrazine sulfate, and derivatives thereof; examples of the hydroquinone compound may include methyl hydroquinone, chloro hydroquinone, methoxy hydroquinone and the like; examples of the boron compound may include sodium borohydride, dimethyl boride amine and the like; and examples of the phosphoric acid compound may include sodium hypophosphite, pyrophosphite, ammonium dihydrogenphosphite ($(NH_4)H_2PO_4$), sodium hypophosphite ($NaH_2PO_2.H_2O$), sodium hexameta phosphate, $(NaPO_3)_6$, and the like. The reductant is not limited to these compounds, and each of these compounds is used independently or as a mixture thereof.

The concentration of the reductant is not particularly limited. However, when the concentration of the reductant is too low, it is difficult to precipitate a metal, and when the concentration thereof is too high, cost increases. Therefore, the concentration of the reductant may be about 0.01 to about 50 g/L, preferably, about 0.1 to about 20 g/L.

As described above, the first metal layer 5 including the protrusions 4 may be formed by introducing the reductant or by performing the thermal reduction reaction.

Figure 4:
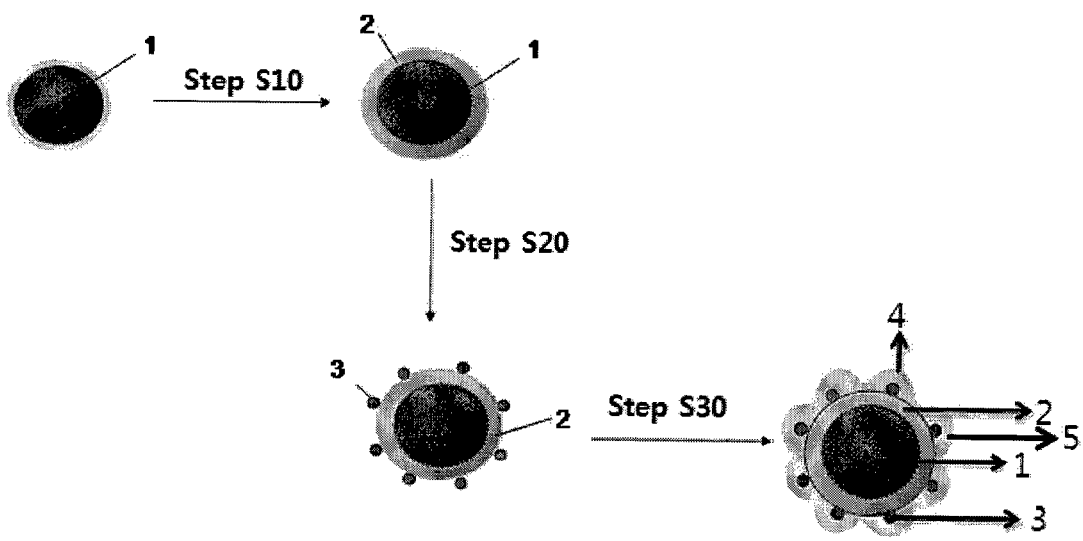
FIG. 4 is a schematic process view showing a method of manufacturing a conductive particle according to another embodiment of the present invention.

FIG. 4 is a schematic process view showing a method of manufacturing a conductive particle according to another embodiment of the present invention.

The method of manufacturing a conductive particle according to another embodiment of the present invention includes the steps of: reacting a base particle containing a metal with a second metal compound solution to form a second metal layer on a surface of the base particle; reacting a transition metal compound solution with the base particle provided with the second metal layer to form a seed particle on a surface of the second metal layer; and reacting a first metal compound with the base particle provided with the seed particle to form a first metal layer including a protrusion surrounding the seed particle on the second metal layer.

Referring to FIG. 4, first, a base particle 1 including a metal is reacted with a second metal compound solution to form a second metal layer 2 on the surface of the base particle 1 (Step S10).

A detailed description of the base particle 1 was aforementioned in the method of manufacturing a conductive particle with reference to FIG. 3.

According to one embodiment of the present invention, the second metal layer 2 may include at least one metal selected from the group consisting of Au, Ag, Co, Cu, Ni, Pd, Pt, Sn and alloys thereof. Preferably, the second metal layer 2 may be made of silver (Ag) or gold (Au), which does not cause a problem of oxidation.

The second metal layer 2 may be formed using a second metal compound solution including a metal, and the second metal compound solution is prepared by dissolving a second metal compound in a solvent.

Specifically, the second metal layer 2 is formed by adding the base particle 1 to the second metal compound solution and then stirring the mixed solution at a predetermined temperature. In this case, the thickness of the second metal layer 2 can be suitably adjusted by controlling the concentration of the second metal compound solution and the reaction temperature. According to one embodiment of the present invention, the second metal layer 2 can be formed to a thickness of 10 to 100 nm.

As the solvent for dissolving the second metal compound, an aliphatic amine compound of 6 to 22 carbon atoms having a linear or branched structure, or an unsaturated amine compound of 6 to 22 carbon atoms having a linear or branched structure may be used. The amine compound may include at least one selected from the group consisting of hexylamine, heptylamine, octylamine, oleylamine, decylamine, dodecylamine, 2-ethylhexylamine, 1,3-dimethyl-n-butylamine, 1-aminotridecane, and mixtures thereof.

The amount of the second metal compound in the second metal compound solution may be about 0.1 to about 30 wt %. When the amount thereof is less than 0.1 wt %, the second metal layer 2 may not be uniformly formed. When the amount thereof is more than 30 wt %, the second metal compound may not be sufficiently dissolved because the amount thereof exceeds the solubility thereof.

It is preferred that a compound, which does not include an anion, such as sulfur (S), chlorine (Cl) or the like, causing a short circuit at the time of forming an electrode, be used as the second metal compound. For example, when a silver (Ag) compound is used as the second metal compound, the silver (Ag) compound may be at least one selected from the group consisting of silver diacetate, silver cyclohexanebutyrate, silver 2-ethylhexanoate, silver neodecanoate and silver acetylacetonate.

Further, the reaction temperature may be changed depending on the kind of the second metal compound used. For example, when a silver compound is used as the second metal compound, the reaction temperature may be set at about 120 to about 220° C., preferably, about 130 to about 210° C.

Subsequently, a transition metal compound solution is reacted with the base particle 1 provided with the second metal layer 2 to form seed particles 3 on the surface of the second metal layer 2 (Step S20).

The seed particles 3 serve as catalyst seeds for forming the following protrusions 4. Detailed descriptions of the seed particles 3 and the forming process thereof were aforementioned in the method of manufacturing a conductive particle with reference to FIG. 3.

Subsequently, a first metal compound is reacted with the base particle 1 provided with the seed particles 3 to form a first metal layer 5 including protrusions 4 surrounding the seed particle 1 on the second metal layer 2 (Step S30).

Detailed descriptions of the first metal layer 5 and the forming process thereof are aforementioned in the method of manufacturing a conductive particle with reference to FIG. 3.

According to one embodiment of the present invention, the first metal layer 5 and the second metal layer 2 may be formed using metal compounds which are the same as each other. Further, the first metal layer 5 and the second metal layer 2 may be formed using metal compounds which are different from each other.

Hereinafter, the present invention will be described in more detail with reference to the following Examples. However, these Examples are set forth to illustrate the present invention, and the scope of the present invention is not limited thereto.

EXAMPLES

Example 1

A copper (Cu) particle having an average particle size of 0.04 μm, prepared by liquid phase reduction, was used as a base particle. Silver diacetate (Ag(CH3COO)2.2H2O, Ag content 68%, manufactured by Junsei Corporation) was used as a metal compound for forming a first metal layer, and palladium acetate (Pd(O2CCH3)2, manufactured by Aldrich Corporation) was used as a metal compound for forming seed particles.

10 g of a copper (Cu) particle having a particle size of 0.04 μm was uniformly dispersed in 80 g of oleylamine (C18H37N) using ultrasonic waves and a homogenizer to prepare a copper particle-dispersed solution.

10 g of silver diacetate was dissolved in 80 g of oleylamine (C18H37N) to prepare a silver compound solution. 1 g of palladium acetate was dissolved in 10 g of octylamine (CH3(CH2)7NH2, manufactured by Aldrich Corporation) to prepare a palladium compound solution.

The copper particle-dispersed solution was introduced into a semicontinuous reactor. Then, the palladium compound solution was introduced into the semicontinuous reactor at a flow rate of 10 mL/min using a proportioning pump while stirring the copper particle-dispersed solution at 80° C. After 5 minutes, the temperature in the semicontinuous reactor was slowly increased to 130° C. at a rate of 5° C./min and then maintained for about 10 minutes.

Subsequently, the silver compound solution was introduced into the semicontinuous reactor at a flow rate of 10 mL/min using the proportioning pump. After the silver compound solution was completely introduced, the temperature in the semicontinuous reactor was slowly increased to 210° C. at a rate of 5° C./min and then maintained for about 10 minutes to complete a reaction for producing a conductive particle.

After the reaction, the temperature in the semicontinuous reactor was decreased to room temperature, 500 mL of ethanol (95%) was introduced into the semicontinuous reactor, and then the produced conductive particle was recovered using a centrifuge.

The recovered conductive particle was completely dried for 24 hours in a vacuum oven.

Example 2

A conductive particle was produced in the same manner as in Example 1, except that a copper (Cu) particle having an average particle size of 2 μm was used as a base particle.

Example 3

A copper (Cu) particle having an average particle size of 0.04 μm, prepared by liquid phase reduction, was used as a base particle. Silver diacetate (Ag(CH3COO)2.2H2O, Ag content 68%, manufactured by Junsei Corporation) was used as a metal compound for forming a first metal layer and a second metal layer, and palladium acetate (Pd(O2CCH3)2, manufactured by Aldrich Corporation) was used as a metal compound for forming seed particles.

10 g of a copper (Cu) particle having a particle size of 0.04 μm was uniformly dispersed in 80 g of oleylamine (C18H37N) using ultrasonic waves and a homogenizer to prepare a copper particle-dispersed solution.

3 g of silver diacetate was dissolved in 80 g of oleylamine (C18H37N) to prepare a silver compound solution. 1 g of palladium acetate was dissolved in 10 g of octylamine (CH3(CH2)7NH2, manufactured by Aldrich Corporation) to prepare a palladium compound solution.

The copper particle-dispersed solution was introduced into a semicontinuous reactor. Then, the silver compound solution was introduced into the semicontinuous reactor at a flow rate of 10 mL/min using a proportioning pump while stirring the copper particle-dispersed solution at 80° C. After the silver compound solution was completely introduced, the temperature in the semicontinuous reactor was slowly increased to 210° C. at a rate of 5° C./min and then maintained for about 10 minutes to complete a first reaction for producing a conductive particle.

After the first reaction, when the temperature in the semicontinuous reactor was decreased to 130° C., the palladium compound solution was introduced into the semicontinuous reactor at a flow rate of 10 mL/min using the proportioning pump. After 10 minutes, when the temperature in the semicontinuous reactor was slowly increased to 190° C. at a rate of 5° C./min, the silver compound solution, prepared by dissolving 10 g of silver diacetate in 80 g of oleylamine (C18H37N), was introduced into the semicontinuous reactor at a flow rate of 10 mL/min using the proportioning pump. After the silver compound solution was completely introduced, the temperature in the semicontinuous reactor was slowly increased to 210° C. at a rate of 5° C./min and then maintained for about 10 minutes to complete a second reaction for producing a conductive particle.

After the second reaction, the temperature in the semicontinuous reactor was decreased to room temperature, 500 mL of ethanol (95%) was introduced into the semicontinuous reactor, and then the produced conductive particle was recovered using a centrifuge.

Comparative Example 1

A copper (Cu) particle having an average particle size of 0.04 μm, prepared by liquid phase reduction, was used as a base particle. Silver diacetate (Ag(CH3COO)2.2H2O, Ag content 68%, manufactured by Junsei Corporation) was used as a metal compound for forming a first metal layer 10 g of a copper (Cu) particle having a particle size of 0.04 μm was uniformly dispersed in 80 g of oleylamine (C18H37N) using ultrasonic waves and a homogenizer to prepare a copper particle-dispersed solution.

10 g of silver diacetate was dissolved in 80 g of oleylamine (C18H37N) to prepare a silver compound solution.

The copper particle-dispersed solution was introduced into a semicontinuous reactor. Then, the silver compound solution was introduced into the semicontinuous reactor at a flow rate of 10 mL/min using a proportioning pump while stirring the copper particle-dispersed solution at 80° C. After the silver compound solution was completely introduced, the temperature in the semicontinuous reactor was slowly increased to 210° C. at a rate of 5° C./min and then maintained for about 10 minutes to complete a reaction for producing a conductive particle. After the reaction, the temperature in the semicontinuous reactor was decreased to room temperature, 500 mL of ethanol (95%) was introduced into the semicontinuous reactor, and then the produced conductive particle was recovered using a centrifuge.

Analysis of Surface and Components of Conductive Particle

Experimental Example 1

The analysis of the surface of the conductive particle produced in Example 1 was carried out by magnifying the conductive particle using a transmission electron microscope (TEM) and a scanning electron microscope (SEM).

Figure 5:
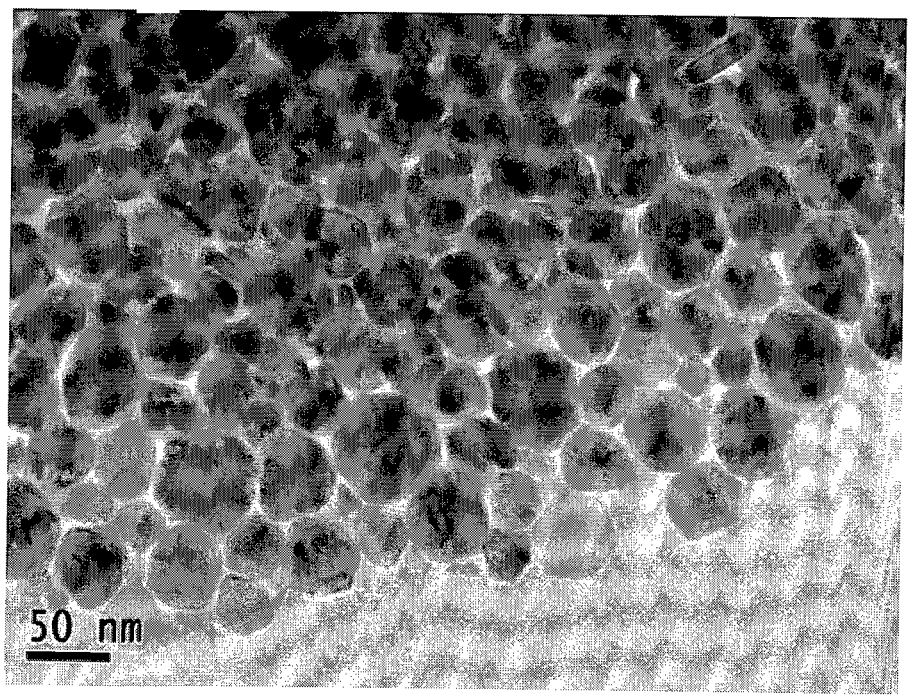
FIG. 5 is a photograph showing a base particle of Example 1 prior to the formation of protrusions, which was magnified 300,000 times using a transmission electron microscope (TEM)

FIG. 5 is a photograph showing a copper (Cu) particle of Example 1 prior to the formation of protrusions, which was magnified 300,000 times using a transmission electron microscope (TEM).

Figure 6:
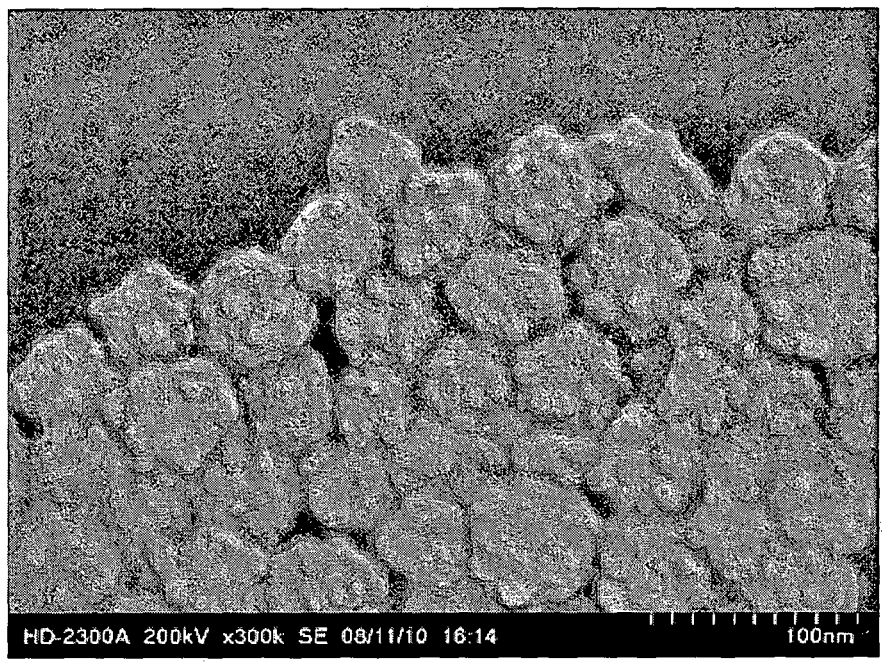
FIG. 6 is a photograph showing a conductive particle manufactured in Example 1, which was magnified 300,000 times using a scanning electron microscope (SEM)

FIG. 6 is a photograph showing a conductive particle produced in Example 1, which was magnified 300,000 times using a scanning electron microscope (SEM).

Figure 7:
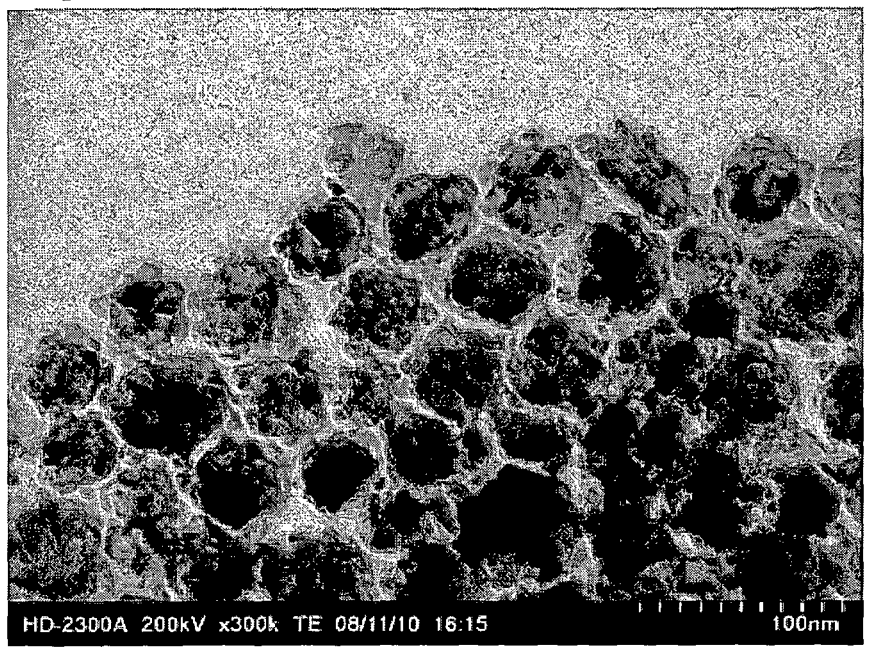
FIG. 7 is a photograph showing a conductive particle manufactured in Example 1, which was magnified 300,000 times using a transmission electron microscope (TEM)

FIG. 7 is a photograph showing a conductive particle manufactured in Example 1, which was magnified 300,000 times using a transmission electron microscope (TEM).

Figure 8:
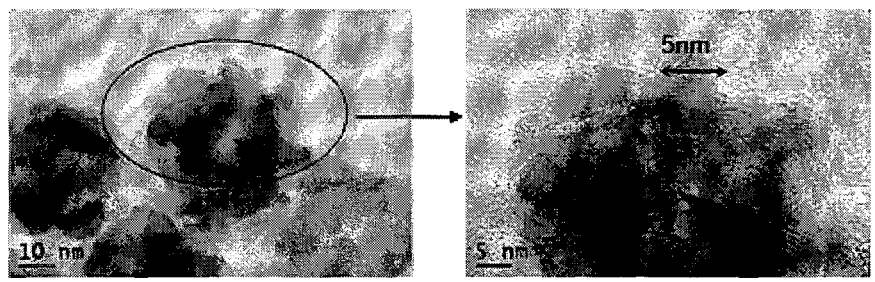
FIG. 8 is an enlarged photograph showing the results of TEM analysis of the conductive particle of FIG. 7.

FIG. 8 is an enlarged photograph showing the results of TEM analysis of the conductive particle of FIG. 7.

Referring to FIGS. 5 to 8, it can be ascertained that protrusions having a size of 5 to 10 nm were formed on the surface of the conductive particle produced in Example 1.

Figure 9:
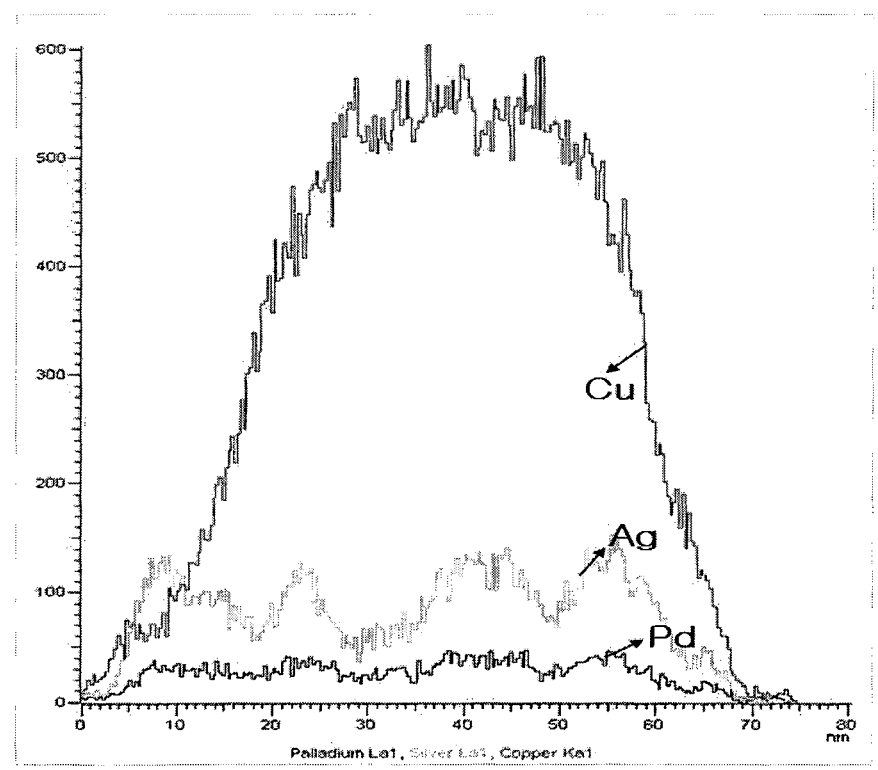
FIG. 9 is a graph showing the results of element analysis of the conductive particle manufactured in Example 1 with respect to the position thereof using energy dispersive X-ray (EDX) analysis.

FIG. 9 is a graph showing the results of element analysis of the conductive particle manufactured in Example 1 with respect to the position thereof using energy dispersive X-ray (EDX) analysis.

Referring to FIG. 9, it can be ascertained that both silver (Ag) and palladium (Pd) exist on the surface of the base particle made of copper (Cu). In the EDX analysis, the metal components of the conductive particle were analyzed with respect to the position thereof by line scanning using a scanning electron microscope (S-4800 FEG SEM) manufactured by Hitachi Corporation) and EDS detectors and EMAX energy software manufactured by Horiba Corporation.

Figure 10:
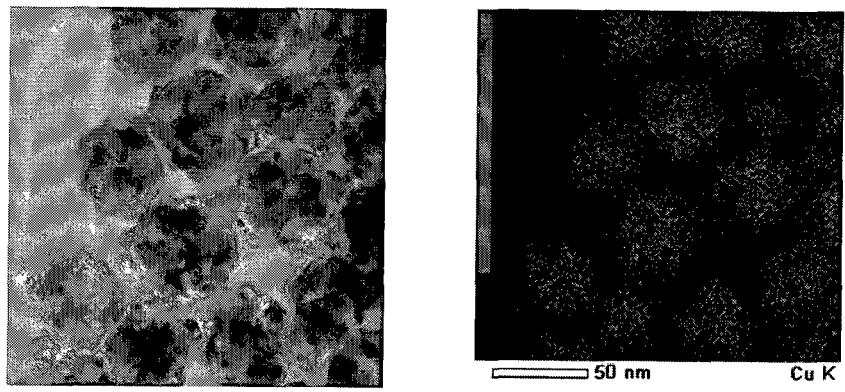
FIG. 10 is photographs showing the results of dot mapping of the conductive particle manufactured in Example 1.
Figure 10:
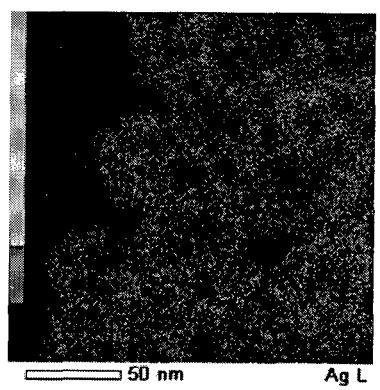

FIG. 10 is photographs showing the results of dot mapping of the conductive particle produced in Example 1.

Referring to FIG. 10, it can be also ascertained that both silver (Ag) and palladium (Pd) exist on the surface of the base particle made of copper (Cu).

Consequently, from the results of FIGS. 5 to 10, it can be ascertained that nanosized protrusions including palladium (Pd) and silver (Ag) were formed on the surface of the copper (Cu) particle. Further, it can be observed that, as the result of analysis of contents of Ag and Cu with respect to the position of the conductive particle, the content of Ag decreases and the content of Cu increases, as the position of the conductive particle is changed from the surface thereof to the center thereof. This result means that an Ag layer was formed on the surface of a Cu particle.

Experimental Example 2

The analysis of the surface of the conductive particle produced in Example 2 was carried out by magnifying the conductive particle using a scanning electron microscope (SEM).

Figure 11:
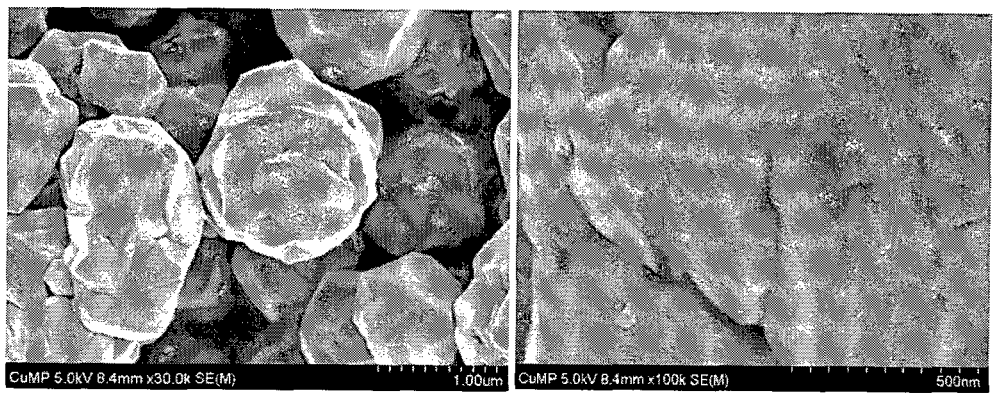
FIG. 11 is photographs showing a base particle of Example 2 prior to the formation of protrusions, which were magnified 30,000 times and 100,000 times, respectively, using a scanning electron microscope (SEM)
Figure 12:
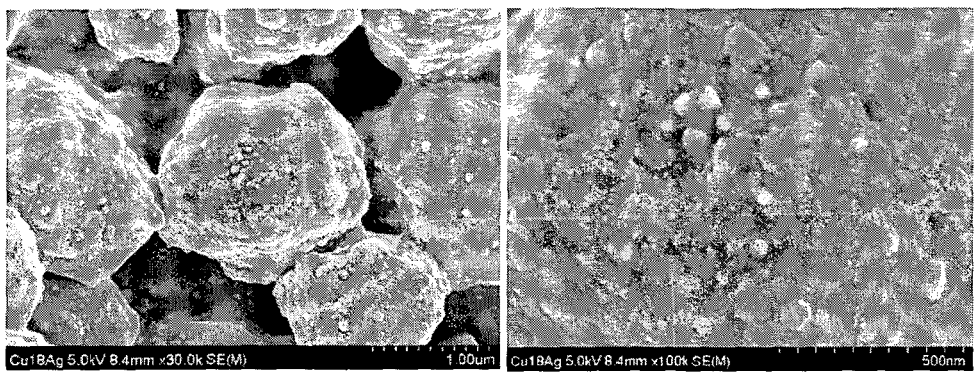
FIG. 12 is photographs showing a conductive particle manufactured in Example 2, which were magnified 30,000 times and 100,000 times, respectively, using a scanning electron microscope (SEM)

FIG. 11 is photographs showing a base particle of Example 2 prior to the formation of protrusions, which were magnified 30,000 times and 100,000 times, respectively, using a scanning electron microscope (SEM), and FIG. 12 is photographs showing a conductive particle produced in Example 2, which were magnified 30,000 times and 100,000 times, respectively, using a scanning electron microscope (SEM).

Referring to FIG. 12, it can be ascertained that protrusions having a size of 10 to 100 nm were formed on the surface of the conductive particle produced in Example 2.

Experimental Example 3

The analysis of the surface of the conductive particle produced in Example 3 was carried out by magnifying the conductive particle using a transmission electron microscope (TEM) and a scanning electron microscope (SEM).

Figure 13:
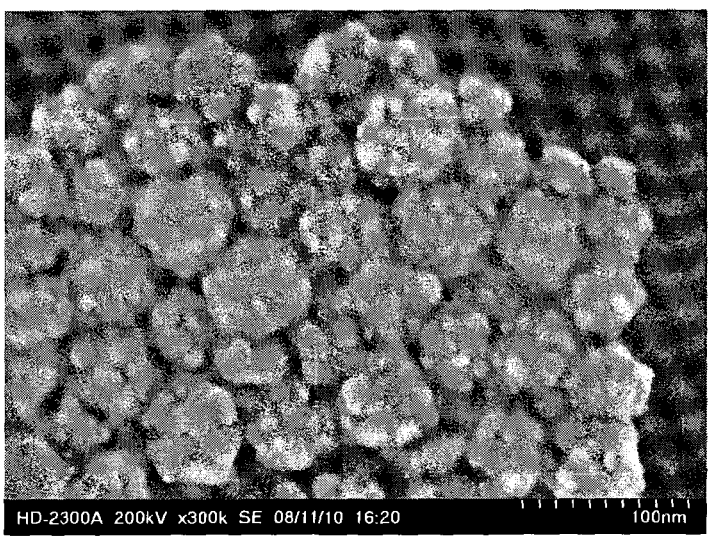
FIG. 13 is a photograph showing a conductive particle manufactured in Example 3, which was magnified 300,000 times using a scanning electron microscope (SEM)
Figure 14:
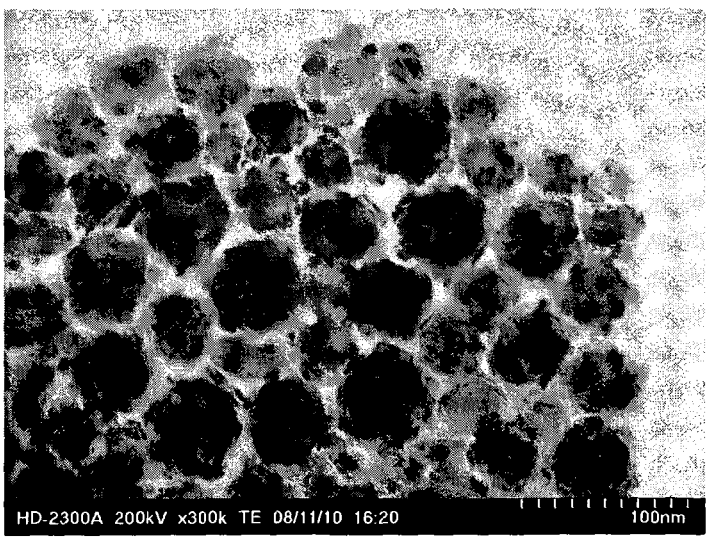
FIG. 14 is a photograph showing a conductive particle manufactured in Example 3, which was magnified 300,000 times using a transmission electron microscope (TEM)
Figure 15:
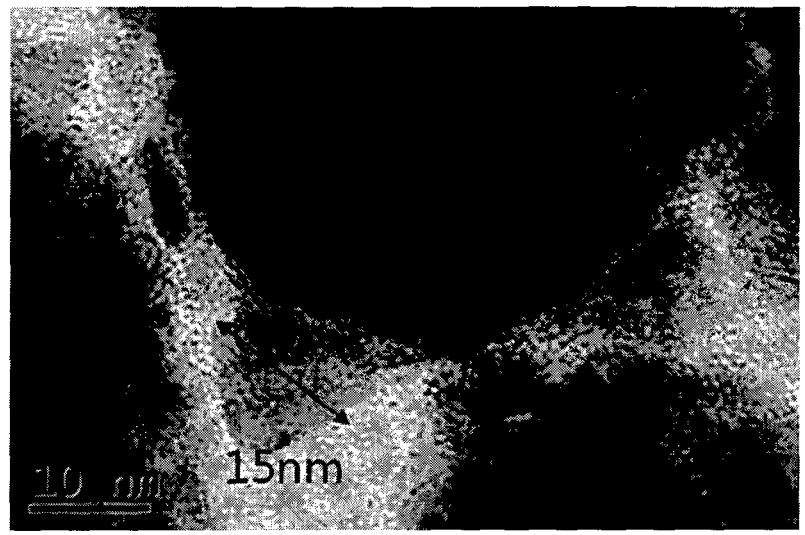
FIG. 15 is an enlarged photograph showing the results of TEM analysis of the conductive particle of FIG. 14.

FIG. 13 is a photograph showing a conductive particle produced in Example 3, which was magnified 300,000 times using a scanning electron microscope (SEM), and FIG. 14 is a photograph showing a conductive particle produced in Example 3, which was magnified 300,000 times using a transmission electron microscope (TEM). FIG. 15 is an enlarged photograph showing the results of TEM analysis of the conductive particle of FIG. 14

Referring to FIG. 15, it can be ascertained that protrusions having a size of 10 to 15 nm were formed on the surface of the conductive particle produced in Example 3.

Comparative Experimental Example 1

Figure 16:
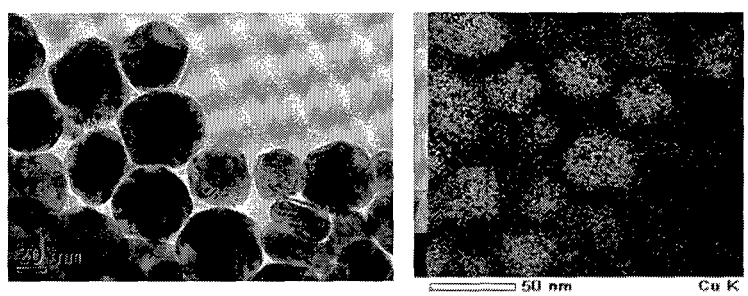
FIG. 16 is photographs showing the results of dot mapping of the conductive particle manufactured in Comparative Example 1.
Figure 16:
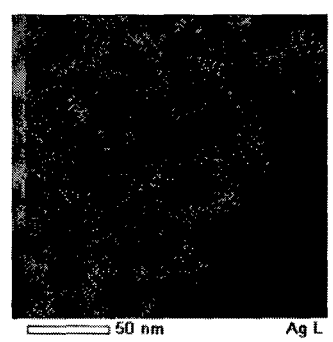
Figure 16:
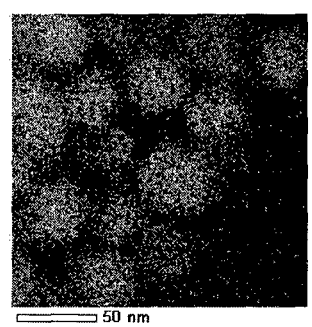

FIG. 16 is photographs showing the results of dot mapping of the conductive particle manufactured in Comparative Example 1.

Referring to FIG. 16, it can be ascertained that protrusions were not formed on the surface of the conductive particle produced in Comparative Example 1 without forming seed particles, and that the conductive particle produced in Comparative Example 1 has a structure in which a Cu particle is uniformly plated with Ag.

Measurement of Specific Resistance (Electroconductivity)

Experimental Example 4

A paste was prepared in order to measure specific resistance (electroconductivity) using the conductive particle produced in Example 1.

The paste was prepared by mixing 85 wt % of the conductive particle of Example 1, 10 wt % of butyl carbitol acetate, 3 wt % of a binder (ethyl cellulose resin, brand name "Ethocel", manufactured by Dow Corporation, standard 100) and 2 wt % of a dispersant (BYK-180) by 3-roll milling. The prepared paste was screen-printed to measure specific resistance depending on sintering temperature.

Comparative Experimental Example 2

A paste was prepared using the conductive particle produced in Comparative Example 2 in the same manner as in Experimental Example 4, and then screen-printed to measure specific resistance depending on sintering temperature.

The results of Experimental Example 4 and Comparative Experimental Example 2 are given in Table 1 below. Further, the results thereof are shown in FIG. 17.

Figure 17:
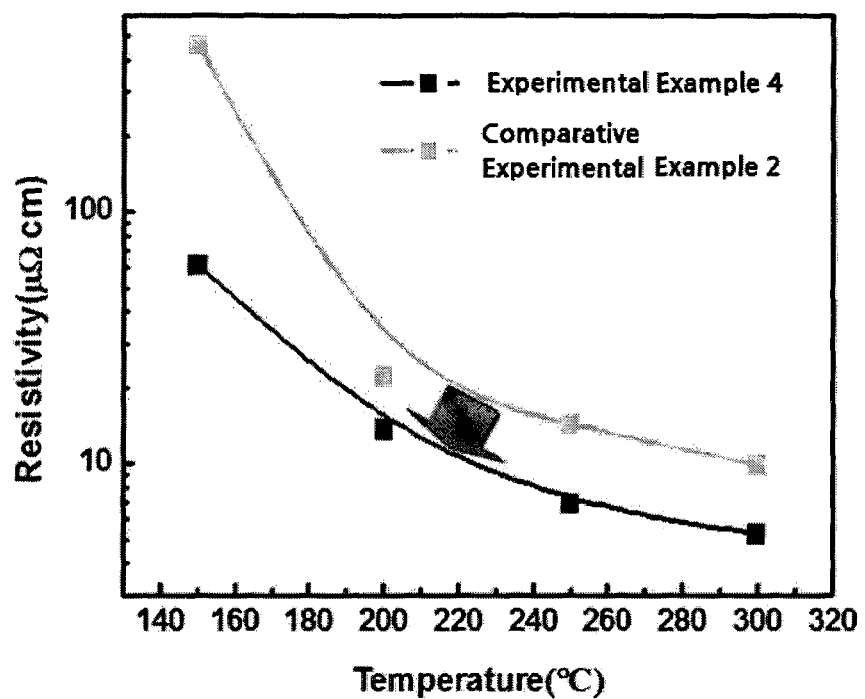
FIG. 17 is a graph showing the results of Experimental Example 4 and Comparative Experimental Example 2.

Referring to Table 1 and FIG. 17, it was analyzed that the paste including the conductive particle produced in Example 1 had excellent specific resistance compared to the paste including the conductive particle produced in Comparative Example 1 over the entire sintering temperature.

Further, it can be ascertained that the width in reduction of specific resistance greatly increases with an increase in sintering temperature, and, particularly, the specific resistance rapidly decreases at sintering temperatures of 150° C. and 200° C., that is, electroconductivity improves.

TABLE 1

| Sintering temperature (unit: ° C.) | Experimental Example 4 (unit: μΩcm) | Comparative Experimental Example 2 (unt: μΩcm) |
|---|---|---|
| 150 | 61.5 | 500.6 |
| 200 | 13.7 | 31.8 |
| 250 | 6.9 | 16.5 |
| 300 | 4.6 | 10.8 |

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A conductive particle, comprising:
   a base particle consisting of a metal;
   a seed particle formed on a surface of the base particle; and
   a first metal layer formed on the base particle,
   wherein the first metal layer includes a protrusion surrounding the seed particle, and
   wherein the first metal layer comprises any one metal selected from the group consisting of Au, Ag, Co, Cu, Sn and alloys including two or more thereof;
   wherein the seed particle comprises any one transition metal selected from the group consisting of Pd, Cu, Ru, Pt, Ag, Co and alloys including two or more thereof,
   wherein the protrusion has a height of 5 to 20 nm.

2. The conductive particle of claim 1, wherein the base particle is a spherical particle having an average particle size of 0.01 to 1,000 µm.

3. The conductive particle of claim 1, wherein the base particle consists of Cu or Ni.

4. The conductive particle of claim 1, wherein the first metal layer includes Ag.

5. A conductive particle, comprising:
a base particle consisting of Cu or Ni;
a first metal layer formed on the base particle;
a seed particle formed on a surface of the first metal layer; and
a second metal layer formed on the first metal layer,
wherein the second metal layer includes a protrusion surrounding the seed particle, and
wherein the first metal layer and the second metal layer are each the same or different and independently comprises any one metal selected from the group consisting of Au, Ag, Co, Cu, Sn and alloys including two or more thereof,
wherein each of the seed particles comprises any one transition metal selected from the group consisting of Pd, Cu, Ru, Pt, Ag, Co and alloys including two or more thereof,
wherein the protrusion has a height of 5 to 20 nm.

6. The conductive particle of claim 5, wherein the base particle is a spherical particle consisting of Cu or Ni and having an average particle size of 0.01 to 1,000 µm.

7. The conductive particle of claim 5, wherein the first metal layer has a thickness of 10 to 100 nm.

8. An electronic device, comprising a conductive pattern including the conductive particle of claim 1.

9. The electronic device of claim 8, wherein the conductive pattern is an electrode pattern of a solar cell, a printed circuit, a flexible circuit board, a touch screen panel, a display or an RFID.

10. A method of manufacturing a conductive particle, comprising the steps of:
reacting a base particle consisting of a metal with a transition metal compound solution to form a seed particle on a surface of the base particle; and
reacting a first metal compound solution with the base particle provided with the seed particle to form a first metal layer including a protrusion surrounding the seed particle,
wherein the first metal compound solution includes: a first metal compound comprising any one metal selected from the group consisting of Au, Ag, Co, Cu, Sn and alloys including two or more thereof; and a solvent,
wherein the protrusion has a height of 5 to 20 nm.

11. The method of claim 10, wherein the base particle consists of Cu or Ni, and is a spherical particle having an average particle size of 0.01 to 1,000 µm.

12. The method of claim 10, wherein the transition metal compound solution includes: a transition metal compound comprising any one transition metal selected from the group consisting of Pd, Cu, Ru, Pt, Ag, Co and alloys including two or more thereof; and a solvent.

13. The method of claim 12, wherein the transition metal compound solution has a concentration of 0.01 to 50 g/L.

14. The method of claim 12, wherein the solvent is an aliphatic amine of 6 to 22 carbon atoms having a linear or branched structure or an unsaturated amine of 6 to 22 carbon atoms having a linear or branched structure.

15. The method of claim 10, wherein the first metal compound is a silver compound.

16. The method of claim 15, wherein the first metal compound comprises at least one silver compound selected from the group consisting of silver diacetate, silver cyclohexanebutyrate, silver 2-ethylhexanoate, silver neodecanoate and silver acetylacetonate.

17. The method of claim 15, wherein an amount of the silver compound in the first metal compound solution is 0.1 to 30 wt %.

18. The method of claim 10, wherein the step of reacting the first metal compound solution with the base particle provided with the seed particle is performed at a temperature at which the first metal compound is thermally decomposed or higher.

19. The method of claim 10, wherein the step of reacting the first metal compound solution with the base particle provided with the seed particle is performed using at least one reductant selected from the group consisting of an ascorbic acid compound, a hydrazine compound, a hydroquinone compound, a boron compound, and a phosphoric acid compound.

20. A method of manufacturing a conductive particle, comprising the steps of:
reacting a base particle consisting of a metal with a first metal compound solution to form a first metal layer on a surface of the base particle;
reacting a transition metal compound solution with the base particle provided with the first metal layer to form a seed particle on a surface of the metal layer; and
reacting a second metal compound with the base particle provided with the seed particle to form a second metal layer including a protrusion surrounding the seed particle on the first metal layer,
wherein the second metal compound solution includes: a second metal compound comprising any one metal selected from the group consisting of Au, Ag, Co, Cu, Sn and alloys including two or more thereof; and a solvent, and
wherein the first metal compound solution includes: a first metal compound comprising any one metal selected from the group consisting of Au, Ag, Co, Cu, Sn and alloys including two or more thereof; and a solvent,
wherein the protrusion has a height of 5 to 20 nm.

21. The method of claim 20, wherein the first metal compound is a silver compound.

22. The method of claim 21, wherein the first metal compound comprises at least one silver compound selected from the group consisting of silver diacetate, silver cyclohexanebutyrate, silver 2-ethylhexanoate, silver neodecanoate and silver acetylacetonate.

23. The method of claim 21, wherein an amount of the silver compound in the first metal compound solution is 0.1 to 30 wt %.

24. The method of claim 20, wherein the step of reacting the first metal compound solution with the base particle is performed at a temperature at which the second metal compound is thermally decomposed or higher.

25. An electronic device, comprising a conductive pattern including the conductive particle of claim 5.

26. The electronic device of claim 25, wherein the conductive pattern is an electrode pattern of a solar cell, a printed circuit, a flexible circuit board, a touch screen panel, a display or an RFID.

* * * * *